United States Patent
Milton et al.

(10) Patent No.: US 10,325,878 B2
(45) Date of Patent: Jun. 18, 2019

(54) METHODS FOR GENERATING WIRE LOOP PROFILES FOR WIRE LOOPS, AND METHODS FOR CHECKING FOR ADEQUATE CLEARANCE BETWEEN ADJACENT WIRE LOOPS

(71) Applicant: Kulicke and Soffa Industries, Inc., Fort Washington, PA (US)

(72) Inventors: Basil Milton, Furlong, PA (US); Wei Qin, Lansfale, PA (US)

(73) Assignee: KULICKE AND SOFFA INDUSTRIES, INC., Fort Washington, PA (US)

( * ) Notice: Subject to any disclaimer, the term of this patent is extended or adjusted under 35 U.S.C. 154(b) by 0 days.

(21) Appl. No.: 15/623,978

(22) Filed: Jun. 15, 2017

(65) Prior Publication Data
US 2018/0005980 A1    Jan. 4, 2018

Related U.S. Application Data

(60) Provisional application No. 62/357,006, filed on Jun. 30, 2016.

(51) Int. Cl.
| | |
|---|---|
| *H01L 21/48* | (2006.01) |
| *H01L 23/00* | (2006.01) |
| *H01L 23/528* | (2006.01) |

(52) U.S. Cl.
CPC .............. *H01L 24/85* (2013.01); *H01L 21/48* (2013.01); *H01L 21/4889* (2013.01); *H01L 23/528* (2013.01); *H01L 24/48* (2013.01); *H01L 24/49* (2013.01); *H01L 24/05* (2013.01); *H01L 2224/05554* (2013.01); *H01L 2224/45014* (2013.01); *H01L 2224/4847* (2013.01); *H01L 2224/48091* (2013.01); *H01L 2224/48095* (2013.01); *H01L 2224/48463* (2013.01); *H01L 2224/4917* (2013.01); *H01L 2224/49052* (2013.01); *H01L 2224/49111* (2013.01); *H01L 2224/49171* (2013.01); *H01L 2224/49175* (2013.01); *H01L 2224/859* (2013.01); *H01L 2224/85123* (2013.01); *H01L 2224/85125* (2013.01); *H01L 2224/85127* (2013.01); *H01L 2224/85129* (2013.01); *H01L 2924/00014* (2013.01)

(58) Field of Classification Search
CPC ..... H01L 21/4885; H01L 24/42; H01L 24/44; H01L 24/74; H01L 24/741

See application file for complete search history.

(56) References Cited

U.S. PATENT DOCUMENTS

| | | | |
|---|---|---|---|
| 8,302,840 B2 | 11/2012 | Qin et al. | |
| 9,496,240 B2 | 11/2016 | Qin et al. | |
| 2009/0042339 A1* | 2/2009 | Embong | H01L 21/4832 438/123 |
| 2012/0065761 A1* | 3/2012 | Qin | B23K 20/004 700/103 |
| 2012/0074206 A1 | 3/2012 | Qin et al. | |

(Continued)

*Primary Examiner* — Cheung Lee

(57) ABSTRACT

A method of generating a wire loop profile in connection with a semiconductor package is provided. The method includes the steps of: (a) providing package data related to the semiconductor package; and (b) creating a loop profile of a wire loop of the semiconductor package, the loop profile including a tolerance band along at least a portion of a length of the wire loop.

21 Claims, 9 Drawing Sheets

(56) References Cited

U.S. PATENT DOCUMENTS

2014/0008796 A1* 1/2014 Choi .................. H01L 23/5221
                                                    257/738
2017/0330841 A1* 11/2017 Cook .................... H01L 23/562

* cited by examiner

METHODS FOR GENERATING WIRE LOOP PROFILES FOR WIRE LOOPS, AND METHODS FOR CHECKING FOR ADEQUATE CLEARANCE BETWEEN ADJACENT WIRE LOOPS

CROSS REFERENCE TO RELATED APPLICATION

This application claims the benefit of U.S. Provisional Patent Application No. 62/357,006, filed Jun. 30, 2016, the contents of which are incorporated herein by reference.

FIELD

The invention relates to the formation of wire loops, and more particularly, to improved methods of generating wire loop profiles for wire loops in a semiconductor package.

BACKGROUND

In the processing and packaging of semiconductor devices, wire bonding continues to be a primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected. For example, wire loops may be formed using a ball bonding machine, a wedge bonding machine, a ribbon bonding machine, etc. Exemplary wire loops formed on a ball bonding machine include (i) a ball bond bonded to a first bonding location (e.g., a die pad of a semiconductor die), (ii) a stitch bond bonded to a second bonding location (e.g., a lead of a leadframe), and (iii) a length of wire between the ball bond and the stitch bond. Exemplary patent documents related to the wire bonding industry include: U.S. Pat. Nos. 8,302,840; 9,496,240; and U.S. Patent Application Publication No. 2001/0072406— wherein each of these patent documents is incorporated by reference in its entirety.

In packages having a high number of wire loops (e.g., high pin-count wire bond applications) wire loops may be overlapping in space (e.g., crisscrossing one another in three dimensional space). The process of on-bonder looping optimization is laborious, and often involves a time period of weeks or months. Further, after the looping optimization is complete, there is no guarantee that all of the wire loops intended to be included in a given package are truly possible. The uncertainty around the feasibility of wire looping forces package designers to consider alternate packaging techniques (other than wire bonding).

Thus, it would be desirable to provide improved methods of generating loop profiles for wire loops in a semiconductor package.

SUMMARY

According to an exemplary embodiment of the invention, a method of generating a wire loop profile in connection with a semiconductor package is provided. The method includes the steps of: (a) providing package data related to the semiconductor package; and (b) creating a loop profile of a wire loop of the semiconductor package, the loop profile including a tolerance band along at least a portion of a length of the wire loop.

The methods of the invention may also be embodied as an apparatus (e.g., as part of the intelligence of a wire bonding machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

Figure 1A:
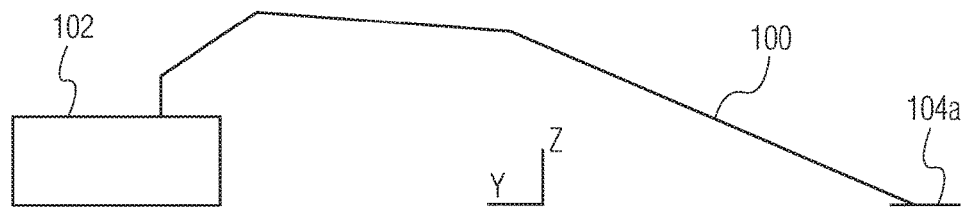
FIG. 1A is a side view of a wire loop useful for explaining certain exemplary embodiments of the invention.

As used herein, the terms "loop profile" or "wire loop profile" refer to specifications of a wire loop shape between a first bonding location (e.g., the location of a ball bond of a wire loop) and a second bonding location (e.g., the location of a stitch bond of the wire loop). The loop profiles are often specified by the user of the wire bonding machine, and include the desired specifications of a given wire loop. For example, the loop profile specifications typically include (i) the number of bends and/or kinks to be included in the wire loop, and (ii) the locations of the bends/kinks in space (e.g., the xyz coordinates with respect to at least one of the first bond location and the second bond location). Since the maximum loop height often occurs at a bend/kink of a wire loop, the loop profile may also include a maximum loop height of the resultant wire loop. Often the terms "loop shape" or "wire loop shape" are used synonymously with "loop profile" or "wire loop profile". In accordance with certain aspects of the invention, the loop profile shall also include a tolerance band provided around (or about) at least a portion of a wire loop.

As used herein, the terms "tolerance band" or "clearance zone" refers to an area (e.g., a 3D zone) around (or about) a given wire loop profile. According to exemplary aspects of the invention, adjacent tolerance bands desirably do not overlap with one another, or if they do, they may overlap within a predetermined specification. Of course, it is an option within the scope of the invention that adjacent tolerance bands may overlap. Further, the tolerance band also applies to other obstructions such as a portion of a die (e.g., a die edge), an adjacent component (e.g., a surface mounted component), etc. That is, according to exemplary aspects of the invention, tolerance bands desirably do not overlap with the location of such obstructions.

In accordance with certain exemplary embodiments of the invention, methods of optimizing wire loop profiles (e.g., wire loop shapes) are provided, including three-dimensional wire loop optimization. The methods may include generating a loop profile for each wire loop in the semiconductor package in 3D. Wire loops often lean and sway when bonded on a wire bonder. Aspects of the invention consider potential defects (e.g., wire lean, wire sway, etc.) of wire loops based on their physical characteristics and establishes a tolerance band (e.g., also referred to as a tolerance zone, a clearance zone, a collision zone, etc.) around each wire. Such tolerance bands may be formed to include, frustums, ellipsoids. Furthermore, methods to perform a clearance/interference check between such tolerance bands allows for a robust loop shape design, and a significant time reduction in looping optimization time.

In order to perform such clearance/interference checks, algorithms (e.g., algorithms run on a computer on the wire bonder, or algorithms run on a computer off the wire bonder, etc.) may utilize wire loop shapes, kink positions, wire spans, wire lengths, wire bond locations, etc. After confirming acceptable wire loop profiles (including acceptable tolerance bands), additional processes (including other algorithms) may be used to determine (e.g., automatically determine using one or more algorithms operating on a computer of the wire bonding machine, or another computer, etc.) the order in which to form wire loops included in a semiconductor package.

Figure 1B:
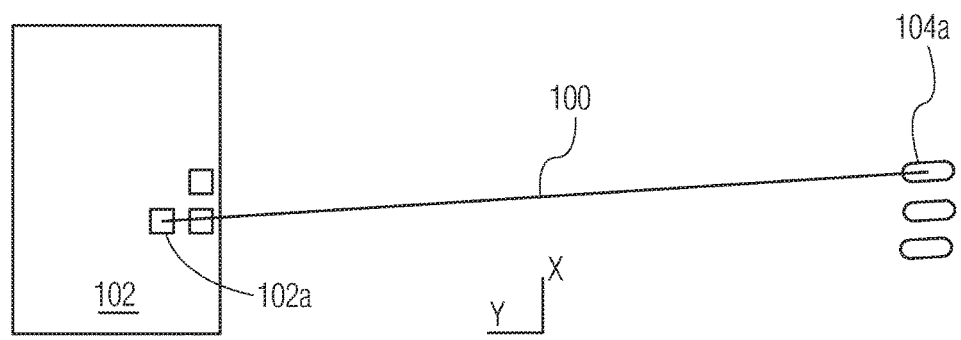
FIG. 1B is a top view of the wire loop of FIG. 1A.
Figure 1C:
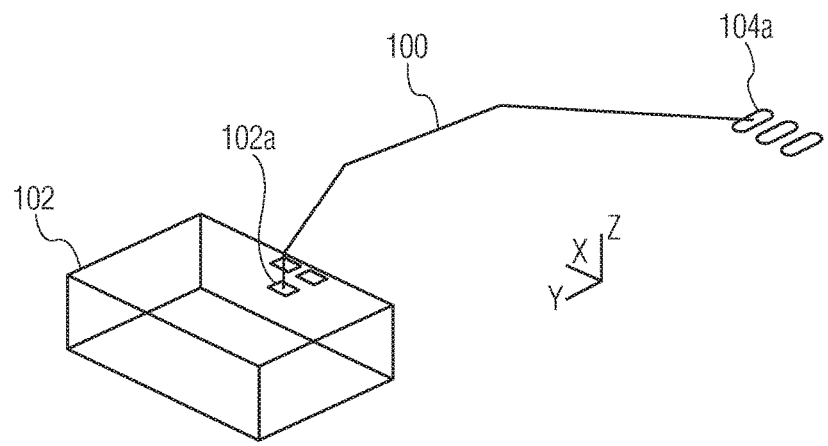
FIG. 1C is a perspective view of the wire loop of FIG. 1A.

Referring now to the drawings, FIG. 1A illustrates a wire loop 100 extending between a semiconductor die 102 and a lead 104a of a leadframe. As can be seen in FIG. 1A, wire loop 100 has a loop profile (e.g., a loop shape), for example, including various kinks, bends, and wire spans. FIG. 1B illustrates wire loop 100 connected to die pad 102a (of semiconductor die 102) on a first end of wire loop 100, and connected to lead 104a on a second end of wire loop 100. FIG. 1C illustrates a perspective view of wire loop 100.

Figure 2A:
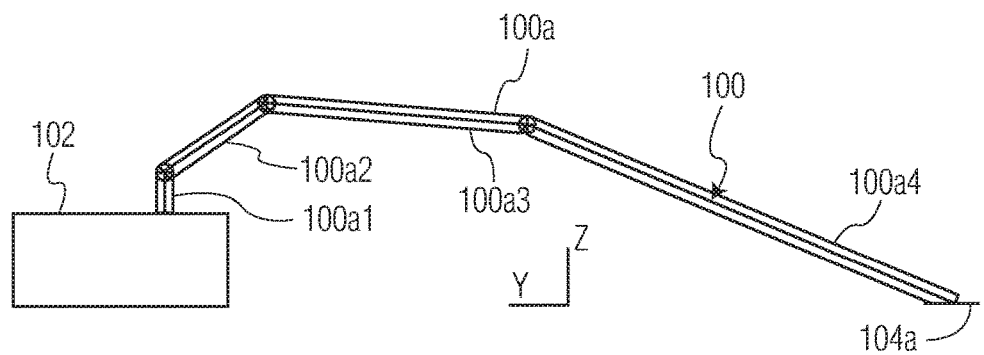
FIG. 2A is a side view of a wire loop including a tolerance band in accordance with an exemplary embodiment of the invention.
Figure 2B:
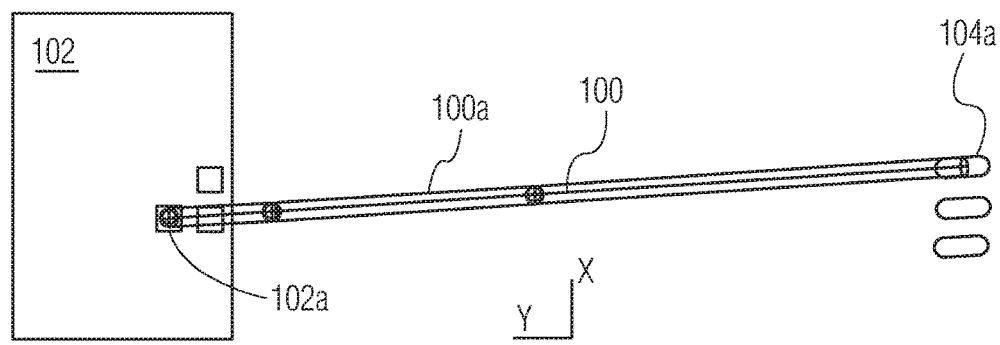
FIG. 2B is a top view of the wire loop of FIG. 2A.
Figure 2C:
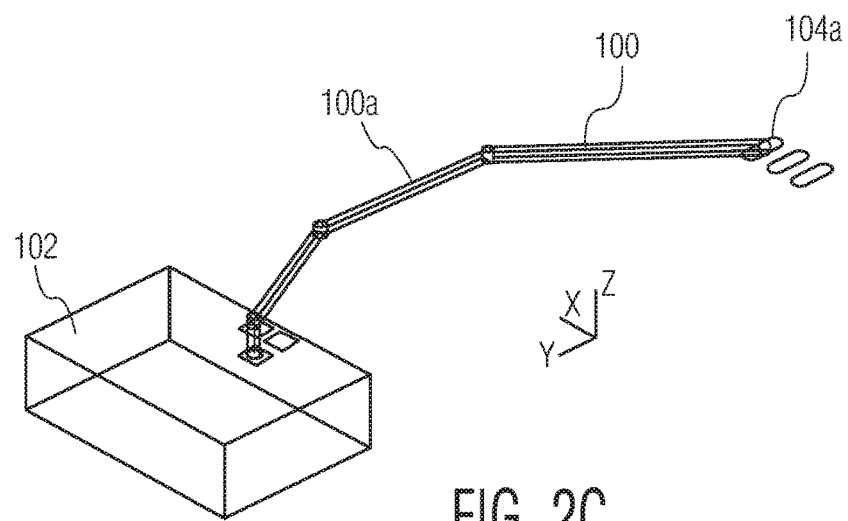
FIG. 2C is a perspective view of the wire loop of FIG. 2A.

In accordance with certain exemplary embodiments of the invention, tolerance bands are included in wire loop profiles. FIGS. 2A-2C illustrate an example of such a loop profile. More specifically, the loop profile of wire loop 100 shown in FIG. 2A includes tolerance band 100a. Tolerance band 100a includes a plurality of sections including section 100a1, section 100a2, section 100a3, and section 100a4. Between the various sections of tolerance band 100a are shapes such as spheres, ellipsoids, etc. In the example shown in FIGS. 2A-2C, the tolerance band has a circular shape that has a uniform diameter along its length. However, it should be understood that tolerance bands included in loop profiles in accordance with the invention may vary significantly. For example, such tolerance bands may have a non-circular shape (e.g., an elliptical or other shape), and such tolerance bands may have a diameter (or other measurable quantity) that varies along the length of the wire loop.

Figure 3A:
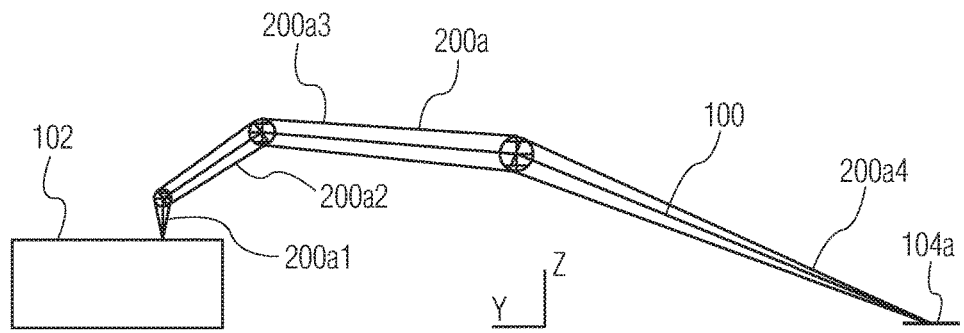
FIG. 3A is a side view of the wire loop of FIG. 2A with a different tolerance band in accordance with an exemplary embodiment of the invention.
Figure 3B:
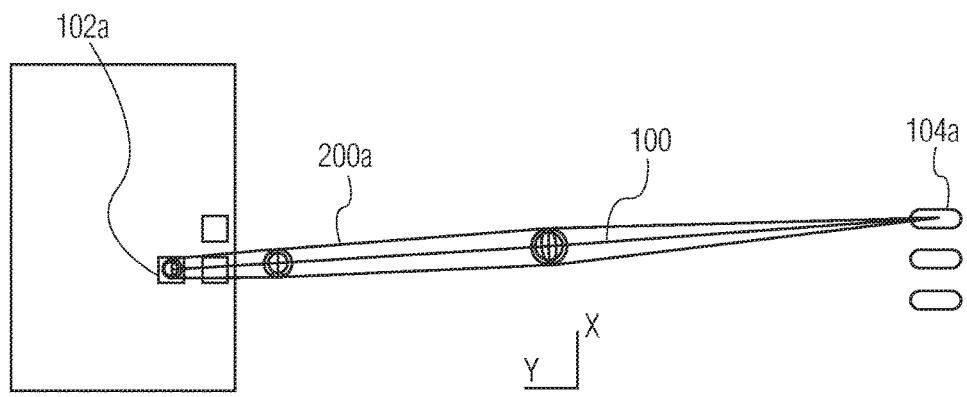
FIG. 3B is a top view of the wire loop of FIG. 3A.
Figure 3C:
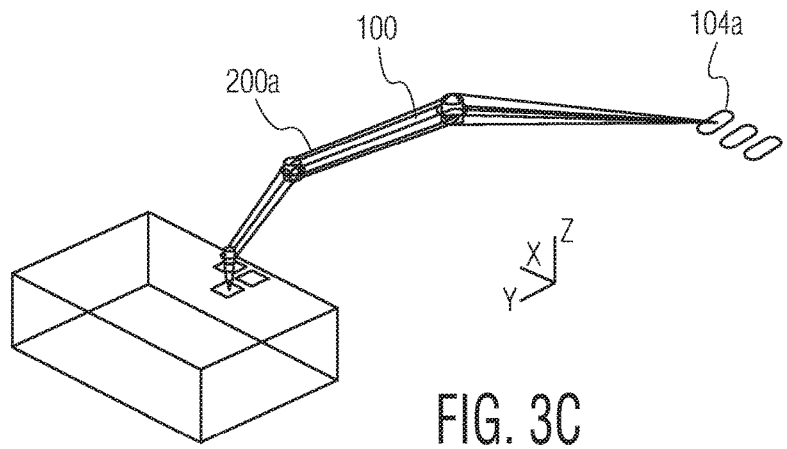
FIG. 3C is a perspective view of the wire loop of FIG. 3A.

FIGS. 3A-3C illustrates a different tolerance band 200a in connection with wire loop 100 as compared with tolerance band 100a shown in FIGS. 2A-2C. As shown in FIGS. 3A-3C tolerance band 200a includes section 200a1, section 200a2, section 200a3, and section 200a4. As further shown in FIGS. 3A-3C, each of sections 200a1, 200a2, 200a3, and 200a4 have shapes that vary along their respective length. For example, referring specifically to section 200a1, the size of the tolerance band increases as the wire extends above away from the first bond location on semiconductor die 102.

Figure 4A:
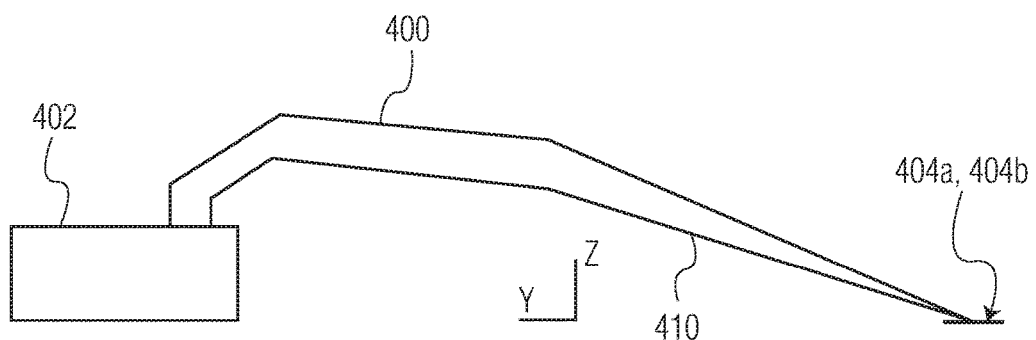
FIG. 4A is a side view of two wire loops useful for explaining certain exemplary embodiments of the invention.
Figure 4B:
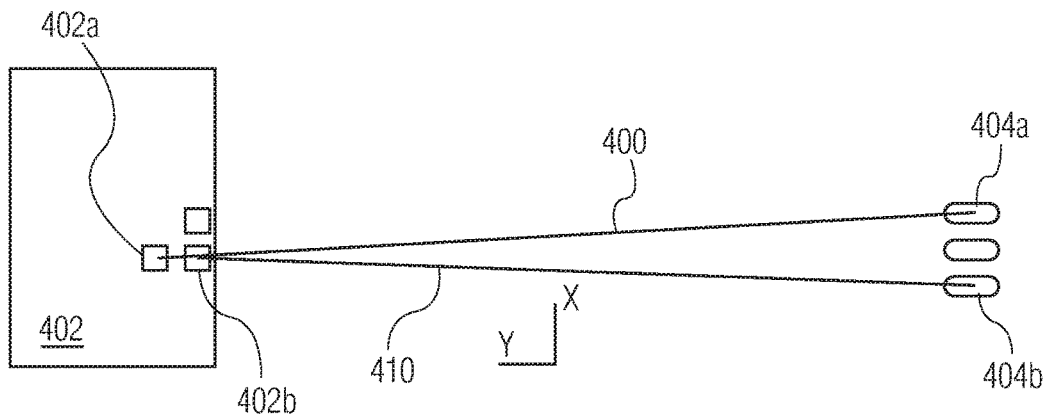
FIG. 4B is a top view of the wire loops of FIG. 4A.
Figure 4C:
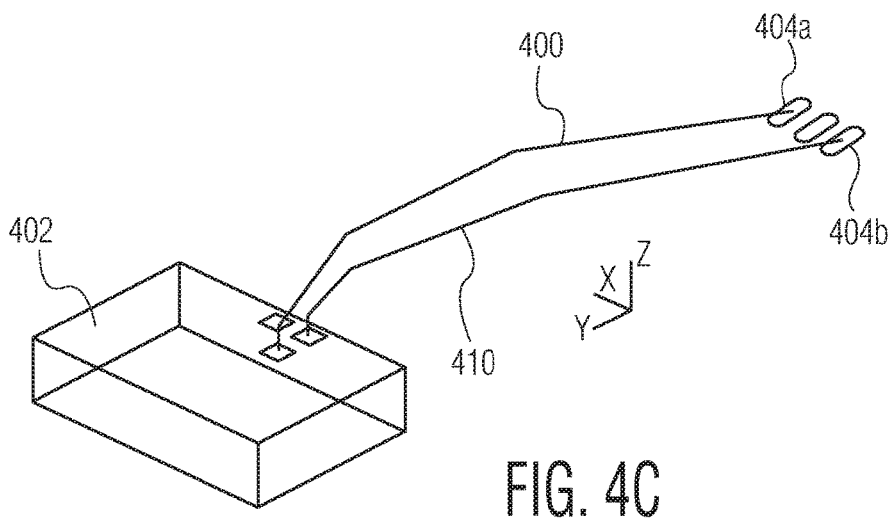
FIG. 4C is a perspective view of the wire loops of FIG. 4A.

In accordance with the invention, loop profiles including tolerance bands are particularly useful in applications having a plurality of wire loops in a semiconductor package (e.g., where one or more of the wire loops may overlap or criss-cross others of the wire loops). FIGS. 4A-4C illustrate two wire loops 400 and 410 extending between a semiconductor die 402 and leads 404a, 404b of a leadframe. More specifically, wire loop 400 extends between die pad 402a and lead 404a. Likewise, wire loop 410 extends between die pad 402b and lead 404b.

Figure 5A:
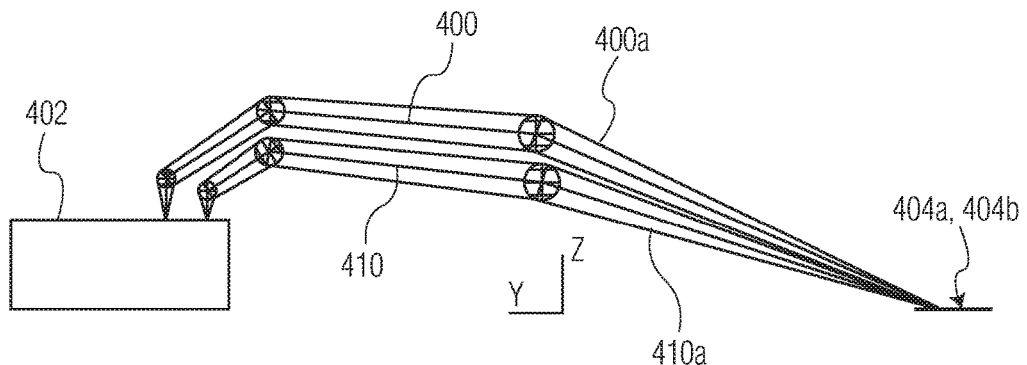
FIG. 5A is a side view of the two wire loops of FIG. 4A including tolerance bands in accordance with an exemplary embodiment of the invention.
Figure 5B:
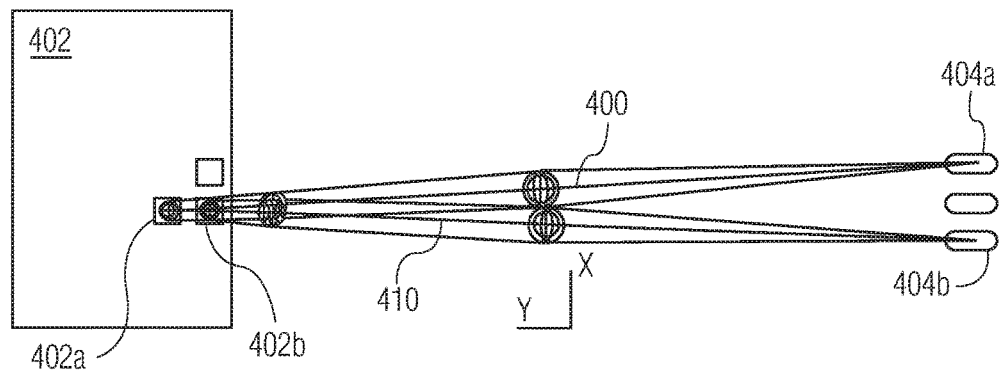
FIG. 5B is a top view of FIG. 5A.
Figure 5C:
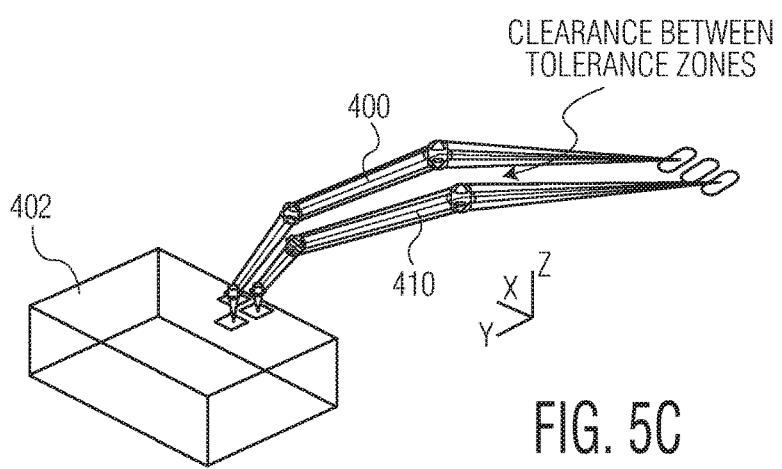
FIG. 5C is a perspective view of FIG. 5A.

FIGS. 5A-5C illustrate loop profiles of wire loops 400 and 410 including tolerance bands. More specifically, wire loop 400 includes tolerance band 400a (where tolerance band 400a includes sections as described above in connection with other tolerance bands), and wire loop 410 includes tolerance band 410a (where tolerance band 410a includes sections as described above). As shown in FIG. 5C, adequate clearance exists between tolerance band 400a and 410a.

In order to determine if there is adequate clearance between adjacent tolerance bands of wire loops, an algorithm (or the like) may be used to check if the adjacent tolerance bands meet predetermined criteria such as an acceptable level of clearance between the adjacent tolerance bands. Such an algorithm may rely on pre-existing data (e.g., in data structures, databases, look-up tables, etc.) in the determination of an acceptable amount of clearance in the given application. If the check indicates that the predetermined criteria is not met (e.g., there is not an acceptable level of clearance between at least a portion of the loop profiles including tolerance bands), one or more of the loop profiles may be adjusted. After the adjustment, another check may be performed to determine if the predetermined criteria is met.

Figure 6A:
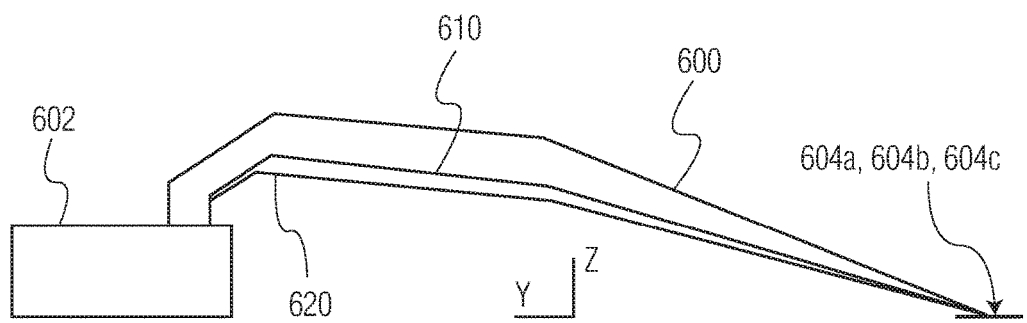
FIG. 6A is a side view of three wire loops, where there is interference between two of the wire loops, useful for explaining certain exemplary embodiments of the invention.
Figure 6B:
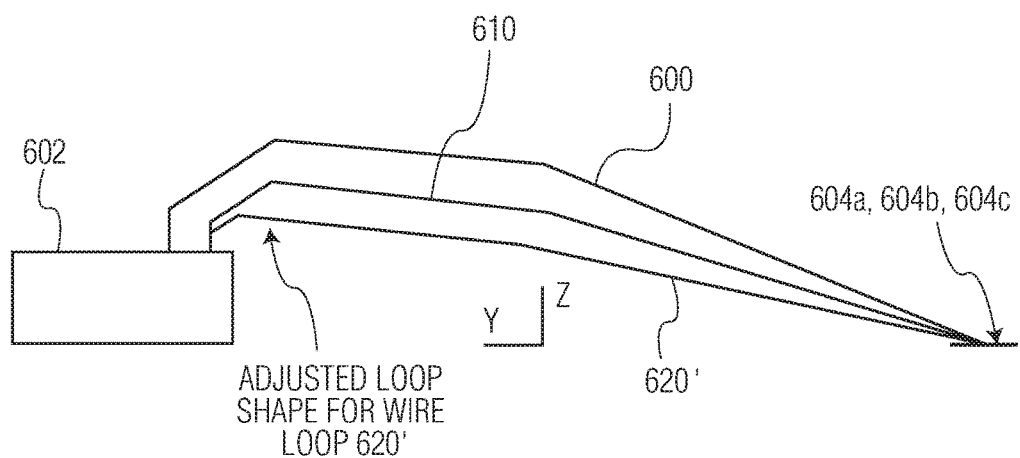
FIG. 6B is a side view of the three wire loops of FIG. 6A, with a loop profile of one of the wire loops having been adjusted, in accordance with an exemplary embodiment of the invention.

FIG. 6A illustrates three wire loops 600, 610, and 620, extending between a semiconductor die 602 and a leads 604a, 604b, 604c of a lead frame. More specifically, wire loop 600 extends between a die pad of semiconductor die 602 (not shown) and lead 604a. Likewise wire loop 610 extends between a die pad of semiconductor die 602 (not shown) and lead 604b. Likewise, wire loop 620 extends between a die pad of semiconductor 602 (not shown) and lead 604c. To illustrate an aspect of the invention, let us assume that the "check" determines that the predetermined criteria is not met for adjacent wire loops 610 and 620. More specifically, let us assume that there is not adequate clearance between the tolerance zones of wire loop 610 and wire loop 620. In the example shown in FIG. 6B the loop profile (e.g., the loop shape) of wire loop 620 (now referred to as wire loop 620') has been changed to provide adequate clearance. Specifically, a kink position of wire loop 620 is changed to derive wire loop 620'. This process is detailed in connection with FIGS. 7A-7C and FIGS. 8A-8C.

Figure 7A:
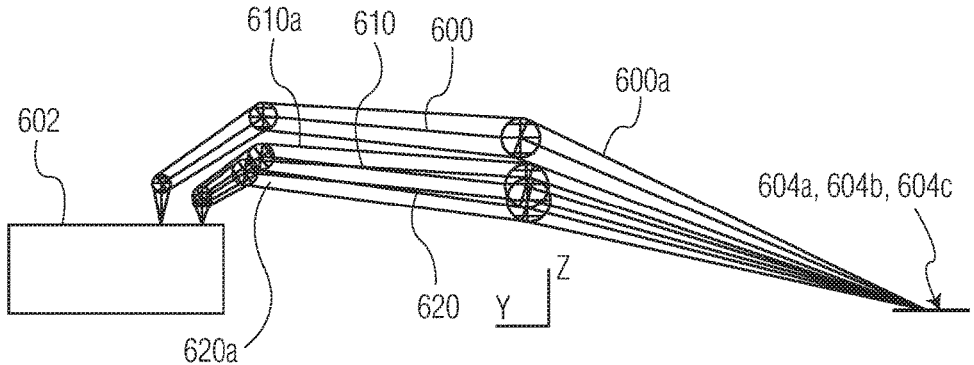
FIG. 7A is a side view of the three wire loops of FIG. 6A including tolerance bands in accordance with an exemplary embodiment of the invention.
Figure 7B:
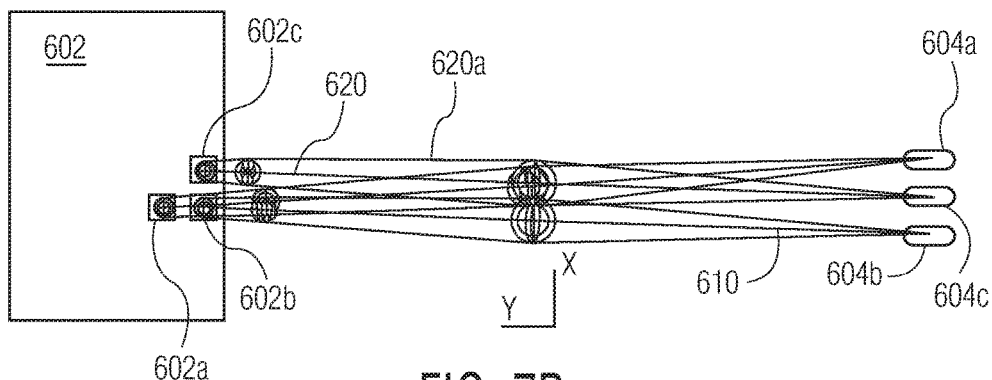
FIG. 7B is a top view of FIG. 7A.
Figure 7C:
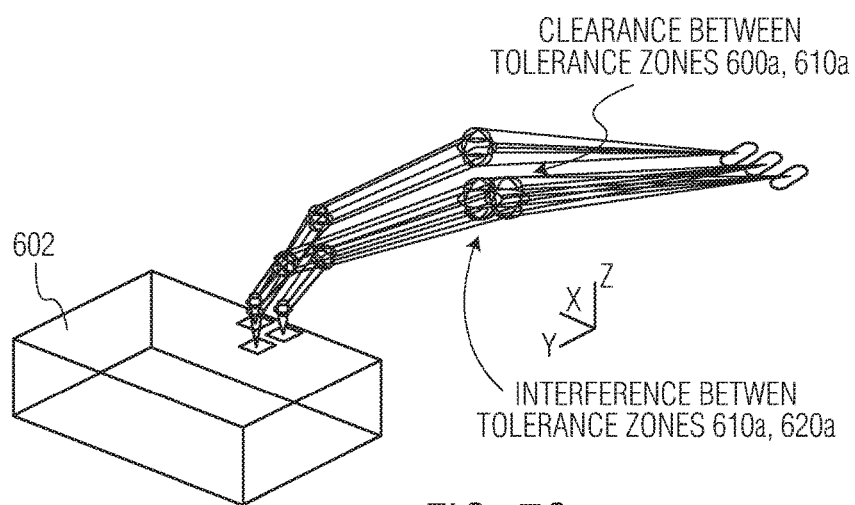
FIG. 7C is a perspective view of FIG. 7A.
Figure 8A:
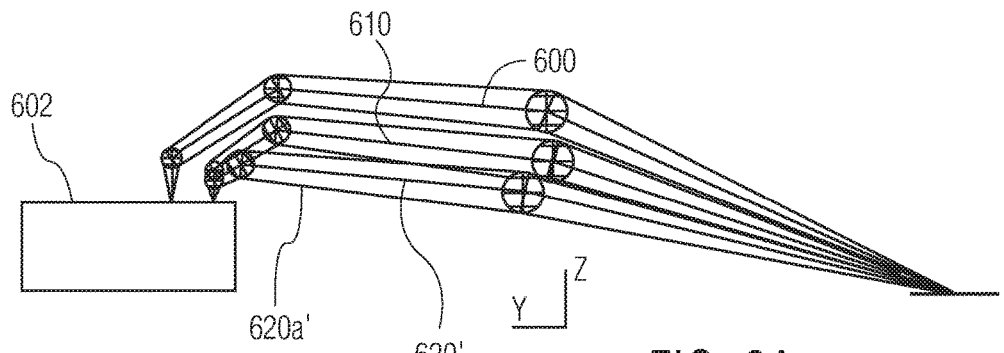
FIG. 8A is a side view of the three wire loops of FIG. 7A, with a loop profile of one of the wire loops having been adjusted, in accordance with an exemplary embodiment of the invention.
Figure 8B:
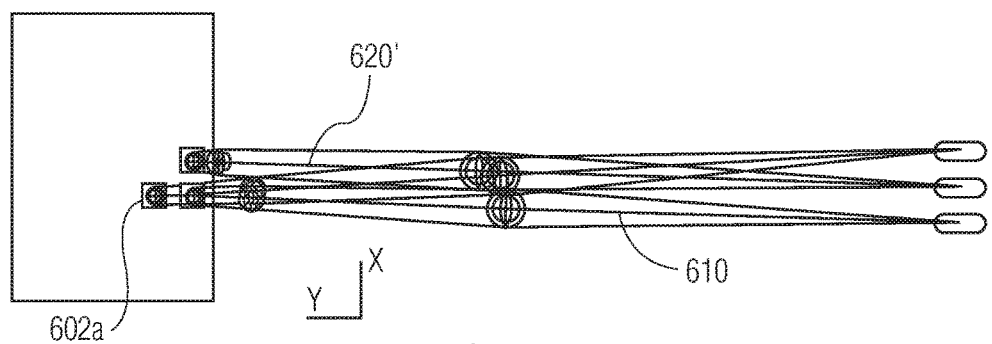
FIG. 8B is a top view of FIG. 8A.
Figure 8C:
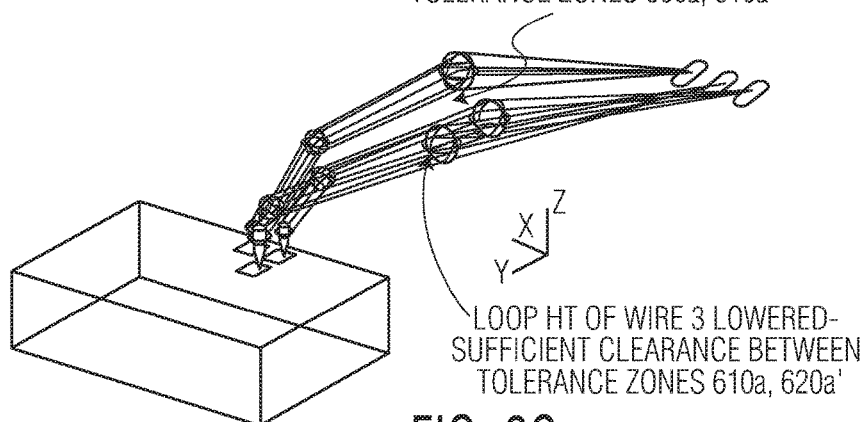
FIG. 8C is a perspective view of FIG. 8A.

Referring specifically to FIGS. 7A-7C, each of wire loops 600, 610, and 620 include respective tolerance bands 600a, 610a, and 620a. As shown in FIG. 7C there is not adequate clearance between tolerance bands 610a and 620a. Referring specifically to FIGS. 8A-8C, where the loop profile of wire loop 620 has been changed (as described above in connection with FIG. 6B, where the wire loop is now labelled as 620') adequate clearance is now provided between tolerance band 610a and 620a'.

Figure 9:
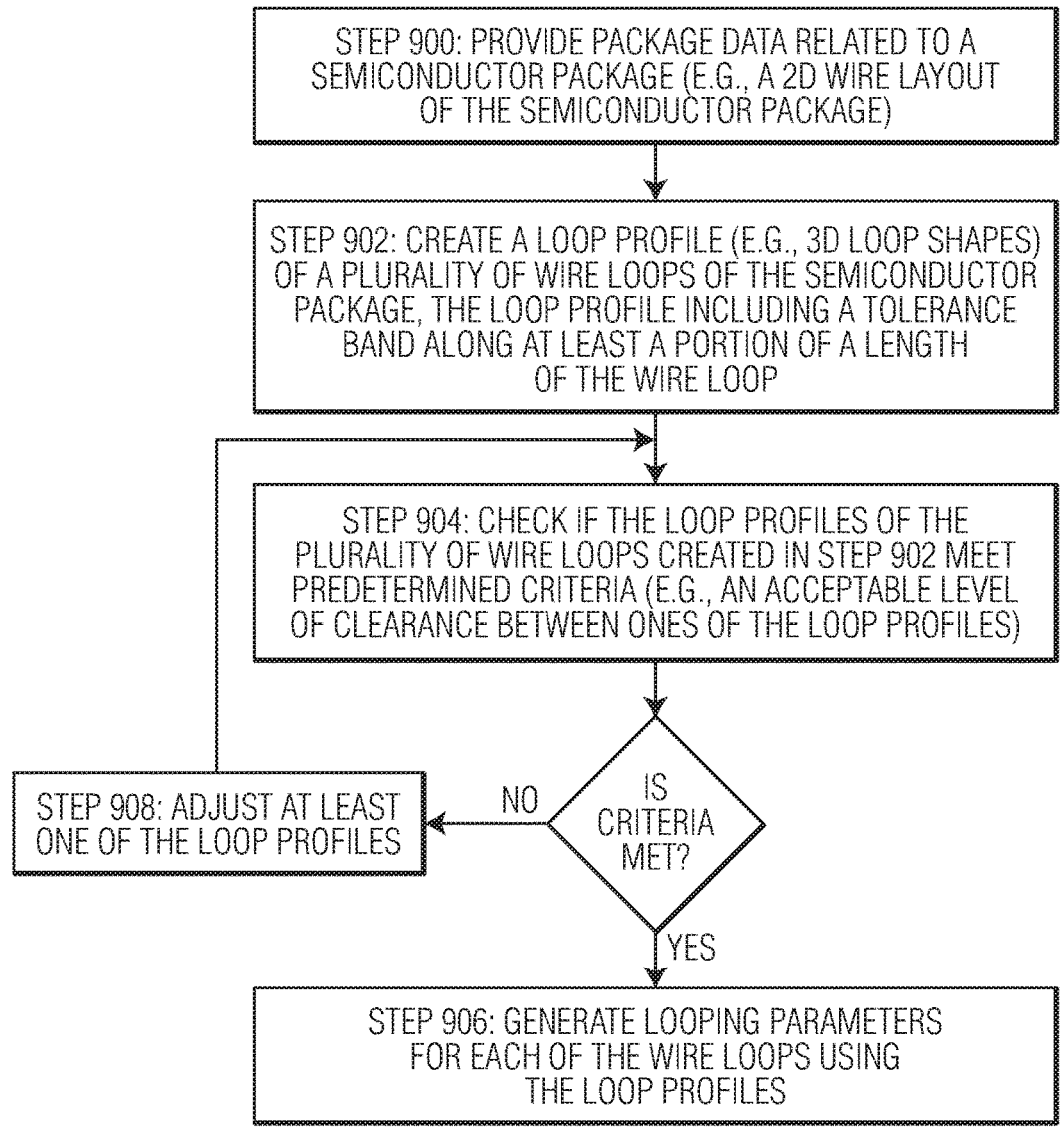
FIG. 9 is a flow diagram illustrating a method of generating a wire loop profile in connection with a semiconductor package, in accordance with an exemplary embodiment of the invention.

FIG. 9 is a flow diagram in accordance with certain exemplary embodiments of the invention. As is understood by those skilled in the art, certain steps included in the flow diagram may be omitted; certain additional steps may be added; and the order of the steps may be altered from the order illustrated.

FIG. 9 illustrates a method of generating a wire loop profile in connection with a semiconductor package. At Step 900, package data (e.g., a two-dimensional wire layout of the semiconductor package) is provided related to the semiconductor package. Such package data may be provided to the wire bonding machine using computer data about the package (e.g., CAD data related to the semiconductor package). In another example, the package data may be provided using an online (e.g., on bonder) teaching reference system of the wire bonding machine. Specific pieces of package data will of course vary from application to application; however, examples of the type of data that may be provided to the wire bonding machine (or offline from the wire bonding machine, for example, to an offline computer system) as package data includes semiconductor die height, die pad locations of a semiconductor die, lead locations of a leadframe, relative distances between first bonding locations and second bonding locations, wire diameter, and wire type.

At Step 902, a loop profile of each wire loop of the semiconductor package is created. The loop profile (e.g., a wire loop shape) includes a tolerance band along at least a portion of a length of the wire loop. At Step 904, a check is performed to determine if the loop profiles of the plurality of wire loops created at Step 902 meet predetermined criteria (e.g., where such predetermined criteria may include an acceptable level of clearance between ones of the loop profiles).

If the predetermined criteria is met (as determined during the check at Step 904), looping parameters are generated for each of the wire loops using the loop profiles at Step 906. If the predetermined criteria is not met (as determined during the check at Step 904), at least one of the loop profiles is adjusted at Step 908 (e.g., see adjustment to loop profile illustrated and described in connection with FIG. 6B and FIGS. 7A-7C). After Step 908, the check is repeated at Step 904 with the adjusted loop profile(s). The process may be repeated until the predetermined criteria is met at Step 906. Alternatively, after a predetermined number of cycles (or time, or other criteria) the process may be abandoned, and the semiconductor device may be considered inappropriate for wire bonding. In yet another alternative, a user may be able to override (e.g., manually or automatically) the predetermined criteria not being met.

In accordance with certain exemplary embodiments of the invention, looping parameters (and therefore, a looping trajectory) are defined using an algorithm(s) running on a computer (e.g., a computer on or off the wire bonding machine). Exemplary looping parameters include: (a) a tool trajectory for forming the wire loop including the end point locations for each segment of the motion and the trajectory between the end points; (b) bonding energy parameters to be applied by a transducer of the wire bonding machine, (c) bonding force parameters to be applied by the wire bonding machine, (d) timing parameters related to at least one of the bonding energy and bonding force, (e) bonding tool speed during at least a portion of a wire bonding cycle to form the desired wire loop, and (f) a wire clamp position during at least a portion of a wire bonding cycle to form the desired wire loop.

In connection with the derivation of the looping parameters, the algorithm may utilize loop model data stored in the wire bonding machine (or stored in another location) to more closely approximate the looping parameters related to the desired wire loop. For example, through experimentation and testing, desirable looping parameters for various types of wire loops, using various wire types may be derived and stored in memory of the wire bonding machine (e.g., through look-up tables or the like) or accessible to the wire bonding machine (through computer networking or the like).

In accordance with the invention, a significant reduction in loop optimization time may be provided. Further, a robust loop shape design may be provided while considering neighboring wire loop shapes. Further still, uncertainty around the feasibility of looping in advanced high pin count applications for package designers may be avoided.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of generating wire loop profiles in connection with a semiconductor package, the method comprising the steps of:
    (a) providing package data related to the semiconductor package; and
    (b) creating loop profiles for a plurality of wire loops of the semiconductor package, each of the loop profiles being generated in consideration of potential defects of the wire loop, and to create a respective tolerance band along at least a portion of a length of the corresponding wire loop, the tolerance band defining a predefined clearance zone around the loop profile.

2. The method of claim 1 wherein step (b) includes creating a three dimensional loop profile of each of the wire loops including the respective tolerance band.

3. The method of claim 1 further comprising the step of (c) checking if the loop profiles of the plurality of wire loops created in step (b) meet predetermined criteria.

4. The method of claim 3 wherein the predetermined criteria includes an acceptable level of clearance between ones of the loop profiles.

5. The method of claim 3 wherein at least one of the loop profiles is adjusted if the loop profiles do not meet the predetermined criteria.

6. The method of claim 1 wherein step (b) is performed using a computer on a wire bonding machine.

7. The method of claim 1 wherein step (b) is performed using a computer separate from a wire bonding machine.

8. The method of claim 1 wherein each of the wire loops connects at least two respective contact points on the semiconductor package.

9. The method of claim 1 wherein the tolerance band is an indication of an acceptable position of the wire loop at a plurality of positions along a length of the wire loop.

10. The method of claim 1 wherein the loop profiles are used to derive looping parameters on a wire bonding machine.

11. The method of claim 10 wherein the looping parameters derived include at least one of (i) a tool trajectory for forming the wire loop, (ii) bonding energy parameters to be applied by a transducer of the wire bonding machine, (iii) bonding force parameters to be applied by the wire bonding machine, (iv) timing parameters related to at least one of the bonding energy and bonding force, (v) bonding tool speed during at least a portion of a wire bonding cycle to form the wire loop, and (vi) a wire clamp position during at least a portion of a wire bonding cycle to form the wire loop.

12. The method of claim 1 wherein step (b) includes generating the loop profiles including the respective tolerance band for each of the plurality of wire loops configured for bonding on the semiconductor package, the tolerance band of each of the plurality of wire loops being a function of the shape of the corresponding loop profile.

13. The method of claim 1 wherein the tolerance band has a circular shape at various points along the length of the wire loop.

14. The method of claim 13 wherein the circular shape of the tolerance band has a uniform diameter.

15. The method of claim 13 wherein the circular shape of the tolerance band has a diameter that varies at different locations along the length of the wire loop.

16. The method of claim 1 wherein the tolerance band has a non-circular shape at various points along the length of each of the wire loops.

17. The method of claim 1 wherein the package data provided in step (a) includes at least one of (a1) CAD data related to the semiconductor package and (a2) package data derived using an online teaching reference system of the wire bonding machine.

18. The method of claim 1 wherein the package data provided in step (a) includes at least one of semiconductor die height, die pad locations of a semiconductor die, lead locations of a leadframe, relative distances between first bonding locations and second bonding locations, a wire diameter, and a wire type.

19. The method of claim 1 wherein the wire loops are formed using a ball bonding process on a ball bonding machine.

20. The method of claim 1 wherein the wire loops are formed using a wedge bonding process on a wedge bonding machine.

21. The method of claim 1 wherein the wire loops are formed using a ribbon bonding process on a ribbon bonding machine.

* * * * *